(12) United States Patent
Jabbour et al.

(10) Patent No.: US 7,015,052 B2
(45) Date of Patent: Mar. 21, 2006

(54) METHOD FOR FABRICATING ORGANIC LIGHT-EMITTING DIODE AND ORGANIC LIGHT-EMITTING DISPLAY USING SCREEN-PRINTING

(75) Inventors: Ghassan E. Jabbour, Tucson, AZ (US); Dino P. Guzman, Tucson, AZ (US); Nasser Peyghambarian, Tucson, AZ (US)

(73) Assignee: The Arizona Board of Regents, Tuscon, AZ (US)

( * ) Notice: Subject to any disclaimer, the term of this patent is extended or adjusted under 35 U.S.C. 154(b) by 231 days.

(21) Appl. No.: 10/109,900

(22) Filed: Apr. 1, 2002

(65) Prior Publication Data

US 2002/0167024 A1 Nov. 14, 2002

Related U.S. Application Data

(60) Provisional application No. 60/279,719, filed on Mar. 30, 2001.

(51) Int. Cl.
*H01L 21/00* (2006.01)
(52) U.S. Cl. .......................... 438/22; 438/216; 438/209

(58) Field of Classification Search ................ 438/209, 438/216, 22
See application file for complete search history.

(56) References Cited

U.S. PATENT DOCUMENTS 6,690,109 B1 * 2/2004 Tada .......................... 313/504
6,780,696 B1 * 8/2004 Schatz ........................ 438/216

* cited by examiner

*Primary Examiner*—David Nelms
*Assistant Examiner*—Renee R. Berry
(74) *Attorney, Agent, or Firm*—Oblon, Spivak, McClelland, Maier & Neustadt, P.C.

(57) ABSTRACT

A method for fabricating organic light-emitting diodes (OLEDs) and OLED displays using screen-printing, where a first electrode, at least one organic material, and a second electrode are formed on a substrate and at least one of the first and second electrodes and the at least one organic material is screen printed by positioning a screen with openings forming a pattern above a substrate and depositing a material onto the substrate through the openings. Exemplary embodiments include fabricating the electrodes and/or the at least one organic material as continuous layers or uniform, discrete blocks on the substrate and fabricating red, green, and blue OLEDs on the same substrate, which are then placed in OLED displays.

21 Claims, 11 Drawing Sheets

METHOD FOR FABRICATING ORGANIC LIGHT-EMITTING DIODE AND ORGANIC LIGHT-EMITTING DISPLAY USING SCREEN-PRINTING

BACKGROUND OF THE INVENTION

1. Field of the Invention

The present invention relates generally to organic light-emitting diodes (OLEDs), OLED displays, and a method for fabricating them.

2. Discussion of the Background

Previously, display technology for high definition (HD) devices, e.g., HD televisions and portable computers, had been dominated by liquid crystal displays (LCDs). However, the liquid crystal display is becoming less desirable with the development of organic light-emitting diodes (OLEDs). OLEDs make use of thin film materials which emit light when fed an electric current. Compared to LCDs, OLED displays are thinner, consume less power, offer a wider viewing angle, and have faster response time. They are particularly useful in devices with miniature display areas.

However, current fabrication methods of OLEDs are expensive, time consuming, and/or limited to certain applications. Such fabrication methods include high vacuum evaporation, spin casting, and high vacuum thermal deposition which are both expensive and time consuming. In addition, high vacuum thermal deposition is limited to fabrication of OLEDs with small molecules rather than polymers.

Polymer-based OLEDs have been fabricated using spin coating, a less expensive, but still time consuming method, such that patterning the OLEDs on a substrate in a single step is not possible. With larger displays, due to the multiple step patterning, uniformity of the OLEDs on the substrate becomes an issue. In addition, spin coating requires substrates having flat surfaces.

Recently, an ink-jet printing method has been developed to fabricate OLEDs using ink-jet printers which deposit the OLED materials on a substrate at a particular resolution similar to the method used by ink-jet printers to deposit ink on paper. However, such methods are currently limited to relatively low resolutions of 300 dpi, for example. This makes the technology unattractive in the fabrication of high definition OLED displays. Moreover, ink-jet printing fabrication is limited to flat surfaces and is time consuming because OLEDs are fabricated one at a time.

SUMMARY OF THE INVENTION

Accordingly, an object of the present invention is to provide a fast, simple, and inexpensive method for fabricating OLEDs.

Another object of the present invention is to provide a method for fabricating OLEDs on various types and shapes of substrates.

Another object of the present invention is to provide a method for fabricating OLEDs which vary in size.

Another object of the present invention is to provide a method for fabricating an OLED display which has high definition/resolution.

These and other objects are accomplished by a novel method for fabricating OLEDs and OLED displays using screen-printing, in which layers of the OLEDs are deposited on the substrate through a screen having openings patterned to create OLEDs at a particular resolution on the substrate.

The method for fabricating the OLEDs includes screen printing on the substrate at least one of a positive electrode, an organic layer which includes positive charge carriers, i.e., holes, an organic layer which includes negative charge carriers, i.e., electrons, and a negative electrode.

The method for fabricating the OLED display includes forming the OLEDs through screen printing and connecting a voltage source to the first and second electrodes.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
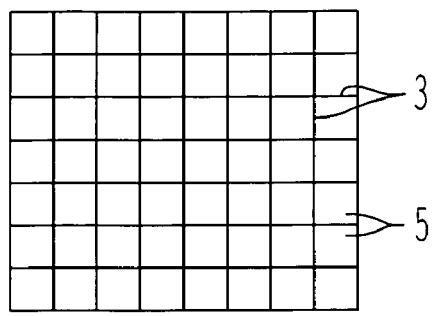
FIG. 1A shows an exemplary screen used for screen-printing in the present invention.

Referring now to the drawings, wherein like reference numerals designate identical or corresponding parts throughout the several views, FIG. 1A shows an example of a screen-printing screen 1 used in OLED fabrication. The screen 1 includes wires 3 which may be made from metal, plastic, or cloth such as polyester, silk, or nylon, for example. The wires 3 partition the screen 1 into small openings 5 through which OLED material is deposited onto a substrate. The spacing and size of the wires 3 determine the pattern of the OLEDs fabricated and hence, the resolution of the device within which the OLEDs are placed. For example, the size of the fabricated OLEDs is determined by the size of the openings 5 which is, in turn, determined by the spacing of the wires 3. And the spacing between the fabricated OLEDs is determined by the width of the wires 3.

As such, the desired OLED pattern may be created easily by varying the spacing and width of the wires 3 to produce a desired HD display resolution. For example, given a specific display size, the screen 1 with the wires 3 spaced farther apart creates larger OLEDs and lower display resolution. Conversely, the screen 1 with the wires 3 spaced closer together creates smaller OLEDs and higher display resolution. Exemplary OLEDs fabricated by screen-printing may be at least as small as 20 μm×110 μm, easily patterned into a resolution of 2560 dpi in an HD display.

In addition, the screen 1 can be used to deposit OLED material onto any kind of substrate surface since the screen 1 is portable and not integral to the substrate. And the screen 1 may be flexible such that it can be shaped to either flat or curved substrate surfaces. Additionally, material deposited by screen-printing may be either too viscous to run and/or held in place by the wires 3 of the screen 1 until the material solidifies such that the separate OLED blocks created by screen-printing do not run together, particularly on non-flat substrate surfaces. The viscosity of the material may vary and is determined by the type and amount of dopants in the material. The flexibility and adaptibility of the screen 1 makes screen-printing in fabricating OLEDs advantageous over other OLED fabrication methods.

Figure 1B:
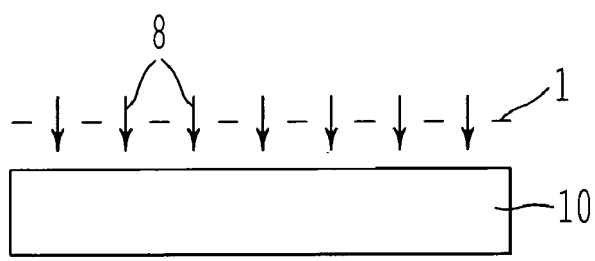
FIGS. 1B and 1C illustrate the screen-printing method using the screen of FIG. 1A.
Figure 1C:
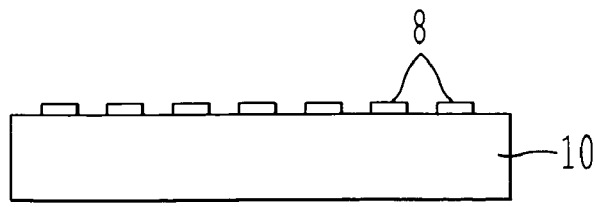

FIGS. 1B and 1C show an exemplary screen-printing deposition using the screen 1 of FIG. 1A. First, as shown in FIG. 1B, the screen 1 is positioned above the substrate 10. The openings 5 in the screen 1 are separated by a spacing which corresponds to the width of the wires 3. The material 8 is deposited evenly through the openings 5 by a screen-printing supplier. The supplier may be a squeegee, a roller, a press, or a painting device, for example, to deposit the material 8 onto the substrate 10. The supplier may deposit the material 8 concurrently through all, some, or one of the openings 5. When the screen 1 is absent, the supplier deposits a continuous layer of the material onto all or portions of the substrate 10 concurrently.

As recognized by the inventors, an advantage of using the screen-printing method is that the material 8 may be deposited through multiple openings 5 concurrently or directly onto all or portions of the substrate 10 concurrently in order to fabricate the OLEDs fast and simply. In addition, in order to vary the size of the OLEDs formed, one screen may simply be replaced by another screen with different size openings, making the fabrication inexpensive compared to other methods which may require replacing suppliers, etc.

After the material 8 is deposited, the screen 1 is removed as shown in FIG. 1C. The material 8 dries on the substrate 10, resulting in the material 8 evenly deposited on the substrate 10 in uniform discrete blocks. If the screen is absent, the material 8 is evenly deposited to form a continuous layer on the substrate 10.

It is to be understood that the screen 1 of FIG. 1A and the screen-printing suppliers of FIGS. 1B and 1C are for exemplary purposes only, as many variations of the specific hardware used to implement the present invention will be readily apparent to one having ordinary skill in the art. For example, the wires 3 may be diagonally arranged in the screen 1.

The screen-printing method of FIGS. 1B and 1C is used to fabricate OLEDs. Electrodes and organic material that form the OLEDs are deposited onto a substrate in like manner.

Figure 2A:
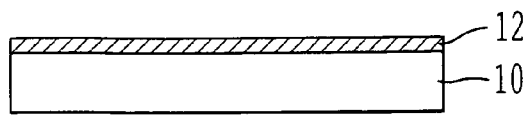
FIGS. 2A–2F show a first embodiment of the screen-printing method of the present invention.

FIGS. 2A–2F show a first embodiment of the fabrication of OLEDs using screen-printing. FIG. 2A shows the deposition of a metallic layer 12 onto a substrate 10. The metallic layer is capable of transporting charge. Exemplary metallic layers include indium tin oxide (ITO). The metallic layer 12 forms a continuous layer on the substrate 10. The metallic layer 12 is then cleaned with an ultrasonic bath of acetone, followed by isopropyl alcohol, followed by methanol, for example.

Figure 2B:
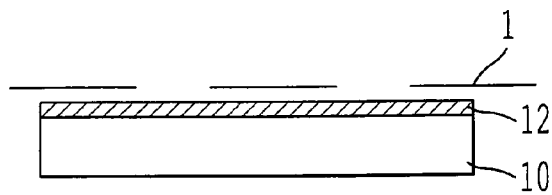

Next, as shown in FIG. 2B, the screen 1 is placed above the metallic layer 12. The openings through which organic material will be deposited onto the metallic layer 12 are shown.

Figure 2C:
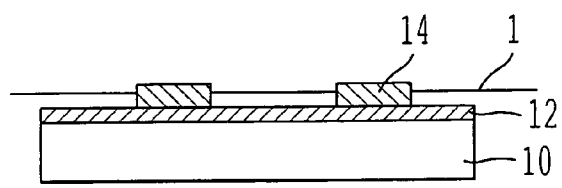

A p-type organic material which is capable of transporting holes is deposited onto the metallic layer 12 through the screen 1. Prior to deposition, an organic material is doped with a p-type dopant to form the p-type organic material. Exemplary organic material includes polymers and/or small organic molecules capable of transporting charge and emitting light, such as polyphenylene vinylene (PPV). The p-type organic material forms p-type organic blocks 14 on the metallic layer 12, as shown in FIG. 2C. The size and spacing of the p-type organic blocks 14 correspond to the size of the openings and the width of the wires, respectively, in the screen 1.

Figure 2D:
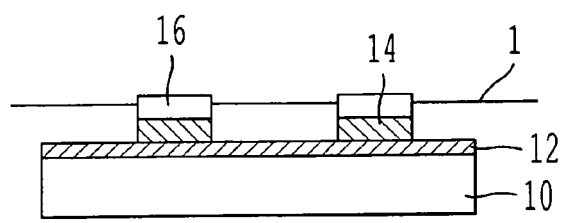

After the p-type organic blocks 14 form, the screen 1 is repositioned and aligned above the p-type organic blocks 14 and n-type organic blocks 16 are formed, as shown in FIG. 2D. The n-type organic blocks 16 are formed from an n-type organic material which is capable of transporting electrons and deposited on the p-type organic blocks 14. Prior to deposition, an organic material is doped with an n-type dopant to form the n-type organic material. Exemplary organic material includes polymers and/or small organic molecules capable of transporting charge and emitting light, such as polyphenylene vinylene (PPV). The size and spacing of the n-type organic blocks 16 are the same as that of the p-type organic blocks 14.

Figure 2E:
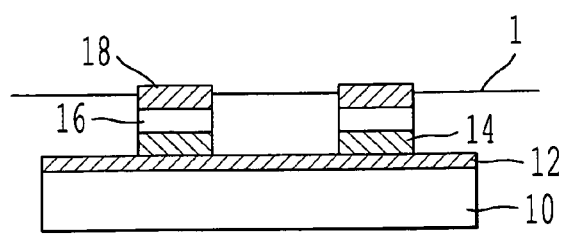

The screen 1 is again repositioned and aligned above the n-type organic blocks 16 and metallic blocks 18 are formed, as shown in FIG. 2E. Exemplary metallic layers include indium tin oxide (ITO). The metallic layer 12 serves as a positive electrode and the metallic blocks 18 serve as negative electrodes. The size and spacing of the metallic blocks 18 are the same as that of the p-type and n-type organic blocks 14 and 16.

Figure 2F:
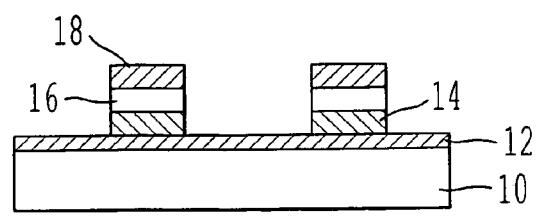

In FIG. 2F, the screen 1 is removed after the metallic blocks 18 form, resulting in the OLEDs fabricated by the screen-printing method.

It is to be understood that the sizes of the blocks 14, 16, and 18 may be different in this embodiment. In this case, different screens may be used to fabricate each set of the blocks 14, 16, and 18, where the openings in the screens are different sizes. In this case, the different screens are aligned such that the openings in the screens are centered over the previously formed blocks. For example, suppose a screen used to form the blocks 16 has smaller openings than the screen that formed the blocks 14. Prior to forming the blocks 16, the screen with the smaller openings is positioned above the blocks 14 such the screen's openings are centered and within the area of the blocks 14. In order for the different screens to be aligned, the number of openings are the same, but the widths of the wires are different for each screen.

Figure 3A:
FIGS. 3A–3F show a second embodiment of the screen-printing method of the present invention.
Figure 3B:
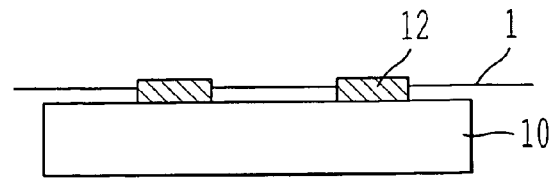
Figure 3C:
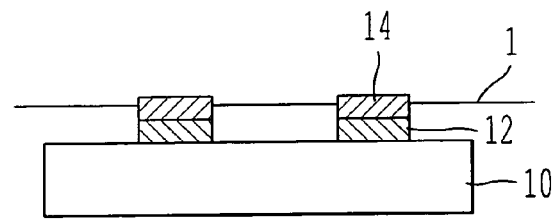
Figure 3D:
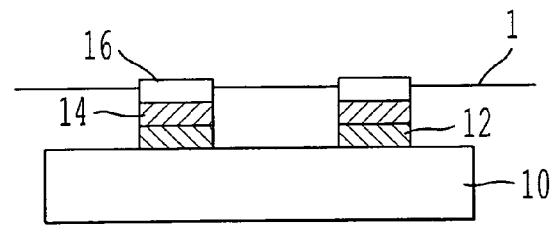
Figure 3E:
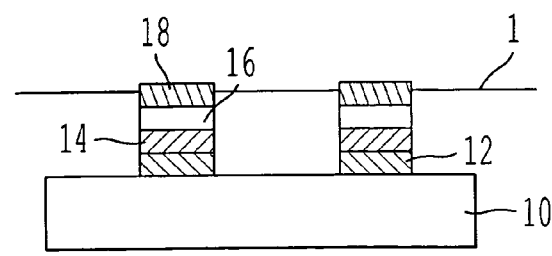

FIGS. 3A–3F show a second embodiment of the fabrication of OLEDs using screen-printing. In this embodiment, the screen 1 is placed above the substrate 10 such that metallic blocks 12 are formed, rather than a continuous layer as in the first embodiment. FIG. 3A shows the screen 1 positioned above the substrate 10. FIG. 3B shows the metallic blocks 12 deposited on the substrate 10 through the openings of the screen 1. The screen 1 is then temporarily removed to clean the metallic blocks 12 with an ultrasonic bath of acetone, followed by isopropyl alcohol, followed by methanol, for example.

Figure 3F:
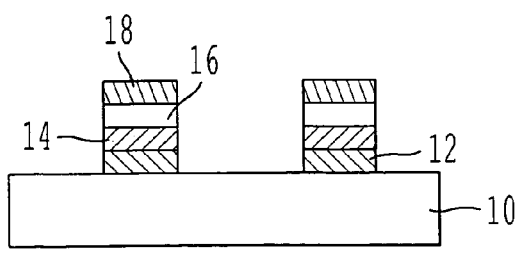

Similar to the method of FIGS. 2C through 2F, the p-type organic blocks 14, the n-type organic blocks 16, and the metallic blocks 18 are formed, as shown in FIGS. 3C through 3F. The result is the OLEDs fabricated by screen-printing as shown in FIG. 3F. The sizes of the blocks 12, 14, 16, and 18 are the same.

However, it is to be understood that the sizes of the blocks 12, 14, 16, and 18 may be different in this embodiment. In this case, different screens may be used to fabricate each set of the blocks 12, 14, 16, and 18, where the openings in the screens are different sizes. The alignment of the different screens may be as previously described.

Figure 4A:
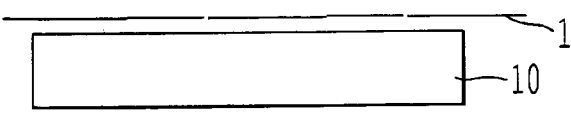
FIGS. 4A–4F show a third embodiment of the screen-printing method of the present invention.
Figure 4B:
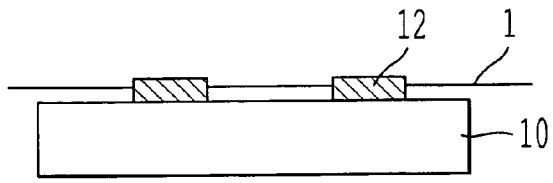

FIGS. 4A–4F show a third embodiment of the fabrication of OLEDs using screen-printing. In this embodiment, the screen 1 is placed above the substrate 10 such that metallic blocks 12 are formed, rather than a continuous layer as in the first embodiment. FIG. 4A shows the screen 1 positioned above the substrate 10. And FIG. 4B shows the metallic blocks 12 deposited on the substrate 10 through the openings of the screen 1. The screen 1 is then temporarily removed to clean the metallic blocks 12 with an ultrasonic bath of acetone, followed by isopropyl alcohol, followed by methanol, for example.

Figure 4C:
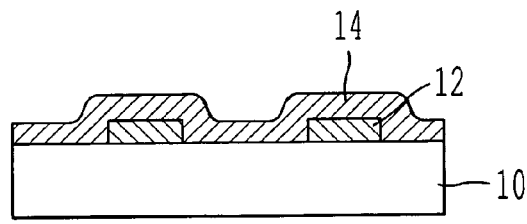

In FIG. 4C, the screen 1 is either removed or replaced by another screen with large openings such that the p-type organic material is deposited to form a continuous layer, a p-type organic layer 14, on the surface of the substrate, covering the metallic blocks 12.

Figure 4D:
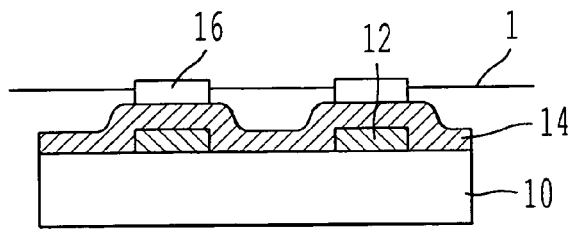

After the p-type organic layer 14 forms, the screen 1 is placed above the p-type organic layer 14 and an n-type organic layer 16 is formed, as shown in FIG. 4D. The n-type organic layer 16 is formed from the n-type organic material.

Figure 4E:
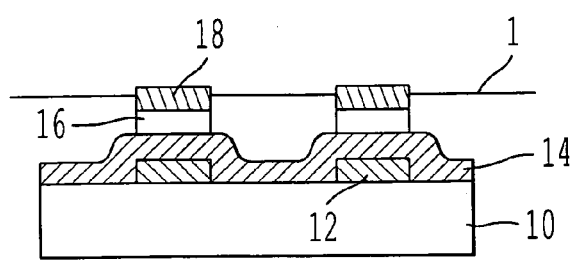

In FIG. 4E, the screen 1 is repositioned above the n-type organic layer 16 and the metallic blocks 18 are formed. The metallic blocks 12 serve as positive electrodes and the metallic blocks 18 serve as negative electrodes. The size and spacing of the metallic blocks 18 are the same as that of the metallic blocks 12.

Figure 4F:
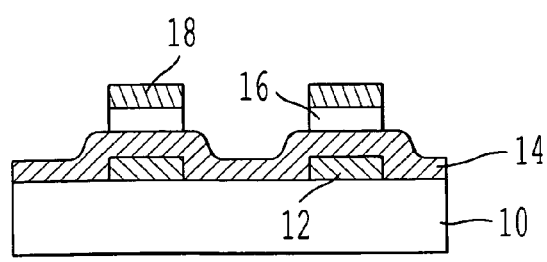

In FIG. 4F, the screen 1 is removed after the metallic blocks 18 form, resulting in the OLEDs fabricated by the screen-printing method.

It is to be understood that the sizes of the metallic blocks 12 and 18 may be different in this embodiment. In this case, different screens may be used to fabricate each set of the blocks 12 and 18, where the openings in the screens are different sizes. The alignment of the different screens may be as previously described. In addition, either of the organic layers 14 and 16 may be replaced with blocks formed by a screen.

Figure 5A:
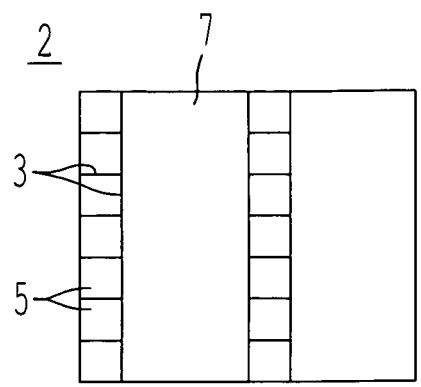
FIG. 5A shows an exemplary screen used for screen-printing in the present invention.

FIG. 5A shows another example of a screen-printing screen 2 used for OLED fabrication. In screen 2, single columns of openings 5 are separated by solid regions 7 that are wider that the openings 5. The wires 3 partition the openings horizontally in the columns and separate the openings 5 from the solid regions 7. The OLED material is deposited onto a substrate through the openings 5. Using the screen 2, deposited material is widely spaced horizontally. The desired OLED pattern may be created easily by varying the spacing and width of the wires 3 to produce a desired HD display resolution. The screen 2 is particularly useful when depositing different types of materials on the same substrate, e.g. materials for red, green, and blue OLEDs.

Figure 5B:
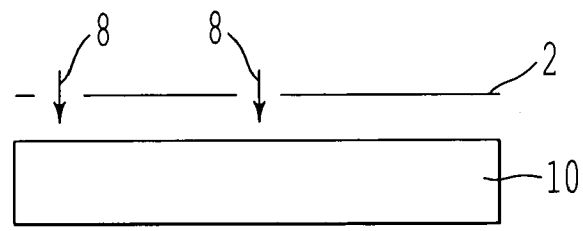
FIGS. 5B and 5C illustrate the screen-printing method using the screen of FIG. 5A.
Figure 5C:
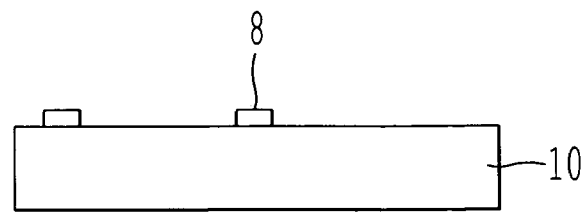

FIGS. 5B and 5C show an exemplary screen-printing deposition using the screen 2 of FIG. 5A. In FIG. 5B, the screen 2 is positioned above the substrate 10. The openings 5 in the screen 2 are separated by a spacing which corresponds to the width of the solid regions 7. The material 8 is deposited evenly through the openings 5 by the screen-printing supplier. As such, the resulting deposition looks like that of FIG. 5C where the organic material 8 after drying is deposited in discrete amount on the substrate 10. When the screen 1 is absent, the supplier deposits a continuous layer of the material onto all or portions of the substrate 10 concurrently.

After the material 8 is deposited, the screen 2 is removed as shown in FIG. 5C. The material 8 dries on the substrate 10, resulting in the material 8 deposited on the substrate 10 in uniform discrete blocks corresponding to the openings 5 in the screen 2. If the screen is absent, the result would be the material 8 evenly deposited to form a continuous layer on the substrate 10.

It is to be understood that the screen 2 of FIG. 5A is for exemplary purposes only, as many variations of the specific hardware used to implement the present invention will be readily apparent to one having ordinary skill in the art. For example, the wires 3, openings 5, and solid regions 7 may be diagonally arranged in the screen 2.

The screen-printing method of FIGS. 5B and 5C is used to fabricate OLEDs. Electrodes and organic material that form the OLEDs are deposited onto a substrate in like manner.

Figure 6A:
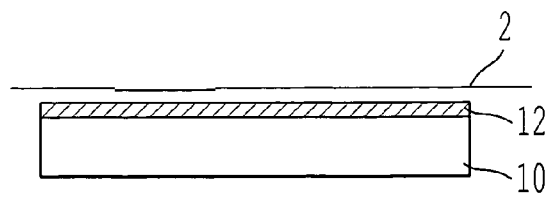
FIGS. 6A–6I show a fourth embodiment of the screen-printing method of the present invention.

FIGS. 6A–6I illustrate a fourth embodiment of the fabrication of OLEDs using screen-printing. The screen 2 of FIG. 5A is exemplary in this embodiment. FIG. 6A shows the deposition of the metallic layer 12 onto the substrate 10 as a continuous layer. The metallic layer 12 is then cleaned with an ultrasonic bath of acetone, followed by isopropyl alcohol, followed by methanol, for example. The screen 2 is positioned above the metallic layer 12. In this embodiment, the opening 5 to the left and the solid region 7 with no openings to the right is indicative of half of the screen 2 shown in FIG. 5A.

Figure 6B:
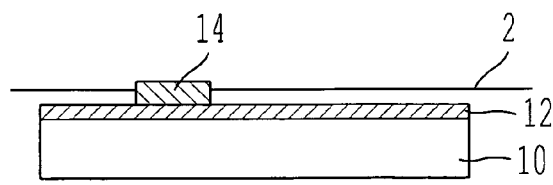

In FIG. 6B, a p-type organic material which is capable of transporting holes is deposited onto the metallic layer 12 through the screen 2. The p-type organic material forms p-type organic blocks 14. A column of the p-type organic blocks 14 are formed on the metallic layer 12 with the size and spacing corresponding to the size of the openings and the width of the wires in the columns, respectively, in the screen 2 as shown in FIG. 5A.

Figure 6C:
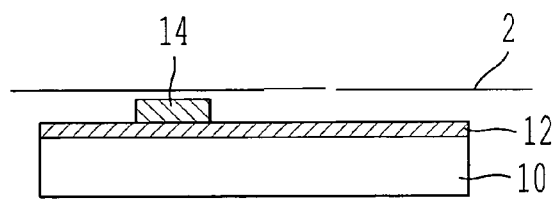
Figure 6D:
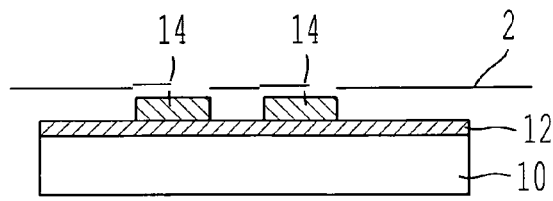

After the column of p-type organic blocks 14 forms, the screen 2 is repositioned and aligned laterally to the column of p-type organic blocks 14 and above the metallic layer 12, as shown in FIG. 6C. A second column of p-type organic blocks 14 is then formed as shown in FIG. 6D from the p-type organic material.

Figure 6E:
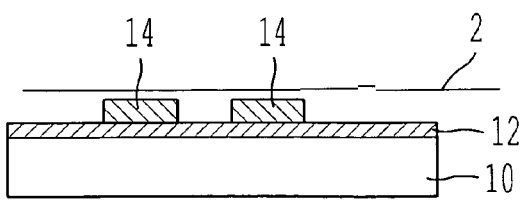
Figure 6F:
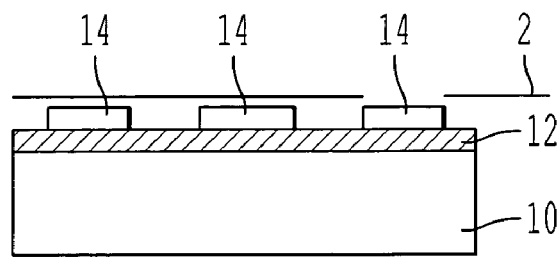

In FIG. 6E, the screen 2 is repositioned and aligned laterally to the second column of p-type organic blocks 14 and above the metallic layer 12, as shown in FIG. 6E. A third column of p-type organic blocks 14 is then formed as shown in FIG. 6F from the p-type organic material.

Figure 6G:
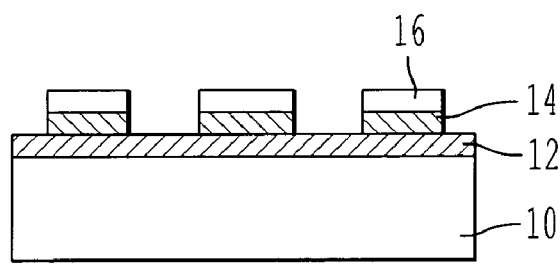

The depositions are repeated for the n-type organic material which are capable of transporting electrons to form the n-type organic blocks 16, as shown in FIG. 6G. The size and spacing of the n-type organic blocks 16 are the same as the size and spacing of the p-type organic blocks 14.

Figure 6H:
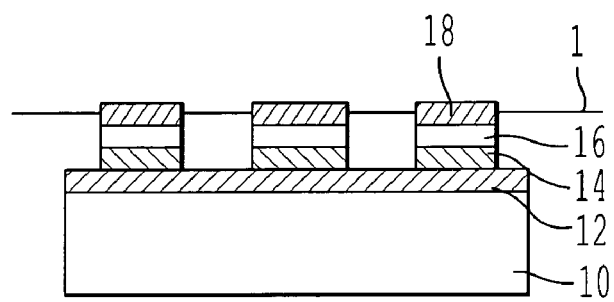

The screen 2 is removed and another screen 1 is positioned and aligned above the n-type organic blocks 16. The metallic blocks 18 are then formed, as shown in FIG. 6H. The metallic layer 12 serves as a positive electrode and the metallic blocks 18 serve as negative electrodes. The size and spacing of the metallic blocks 18 are the same as that of the p-type and n-type organic blocks 14 and 16.

Figure 6I:
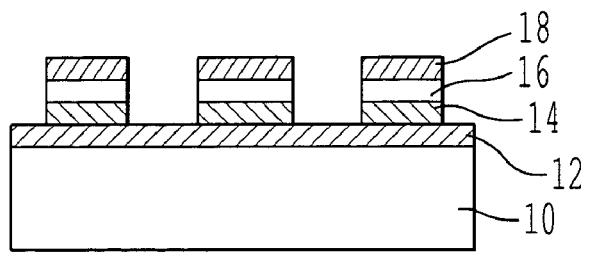

In FIG. 6I, the screen 1 is removed after the metallic blocks 18 form, resulting in the OLEDs on the substrate 10 fabricated by the screen-printing method. The structures of the OLEDs of FIGS. 3A–3F may be formed similarly for the OLEDs.

It is to be understood that the sizes of the p-type, n-type, and metallic blocks 14, 16, and 18 may be different in this embodiment. In this case, different screens may be used to fabricate each set of the blocks, where the openings in the screens are different sizes. The alignment of the different screens may be as previously described.

Figure 7A:
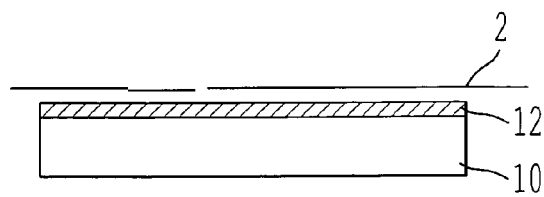
FIGS. 7A–7I show a fifth embodiment of the screen-printing method of the present invention in which red, blue, and green OLEDs are fabricated in the present invention.

FIGS. 7A–7I illustrate a fifth embodiment of the fabrication of OLEDs in which red, green, and blue OLEDs are fabricated on the same substrate. Three different types of organic material are used to fabricate the OLEDs to emit red, green, and blue light. Exemplary organic material includes polymers and/or small organic molecules capable of transporting charge and emitting light, such as polyphenylene vinylene (PPV). The different dopants in the organic material determine the color of light emitted. The screen 2 of FIG. 5A is exemplary in this embodiment. FIG. 7A shows the deposition of the metallic layer 12 onto the substrate 10 as a continuous layer. The metallic layer 12 is then cleaned with an ultrasonic bath of acetone, followed by isopropyl alcohol, followed by methanol, for example. The screen 2 is positioned above the metallic layer 12. In this embodiment, the opening 5 to the left and the solid region 7 with no openings to the right is indicative of half of the screen 2 shown in FIG. 5A.

Figure 7B:
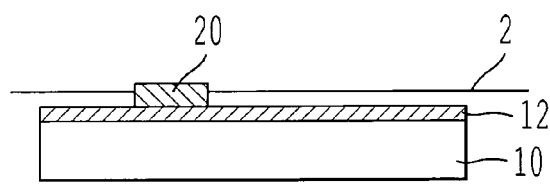

In FIG. 7B, a p-type organic material which is capable of transporting holes and emitting red light is deposited onto the metallic layer 12 through the screen 2. The p-type organic material forms red p-type organic blocks 20. A column of the red p-type organic blocks 20 are formed on the metallic layer 12 with the size and spacing corresponding to the size of the openings and the width of the wires in the columns, respectively, in the screen 2 as shown in FIG. 5A.

Figure 7C:
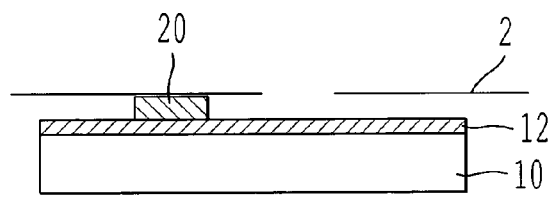
Figure 7D:
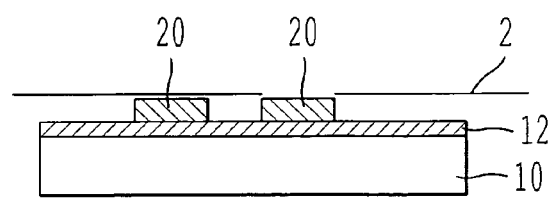

After the red p-type organic blocks 20 form, the screen 2 is repositioned and aligned laterally to the red p-type organic blocks 20 and above the metallic layer 12, as shown in FIG. 7C. Green p-type organic blocks 22 are then formed as shown in FIG. 7D from a p-type organic material which is capable of transporting holes and emitting green light.

Figure 7E:
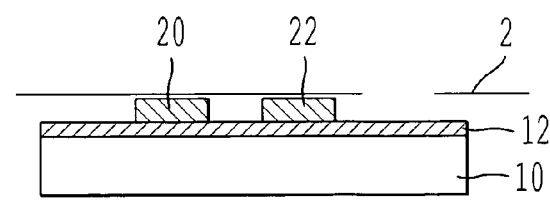
Figure 7F:
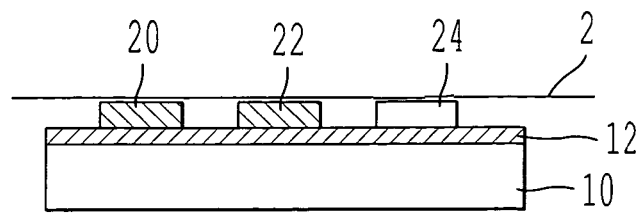

In FIG. 7E, the screen 2 is repositioned and aligned laterally to the green p-type organic blocks 22 and above the metallic layer 12, as shown in FIG. 7E. Blue p-type organic blocks 24 are then formed as shown in FIG. 7F from a p-type organic material which is capable of transporting holes and emitting blue light. The result is the red, green, and blue p-type organic materials 20, 22, and 24 respectively, formed on the same substrate.

Figure 7G:
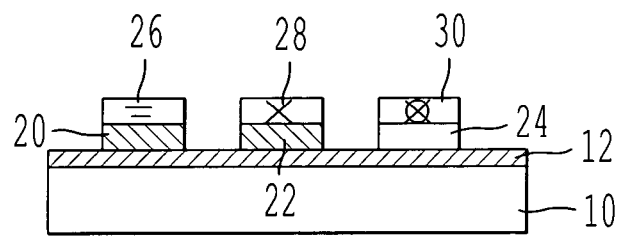

The depositions are repeated for n-type organic materials which are capable of transporting electrons and emitting red, green, and blue light to form, respectively, red, green, and blue n-type organic blocks 26, 28, and 30, as shown in FIG. 7G. The red n-type organic blocks 26 are formed onto the red p-type organic blocks 20. Similarly, the green and blue n-type organic blocks 28 and 30 are formed onto the green and blue p-type organic blocks 22 and 24. The size and spacing of the n-type organic blocks 26, 28, and 30 are the same as the size and spacing of the p-type organic blocks 20, 22, and 24.

Figure 7H:
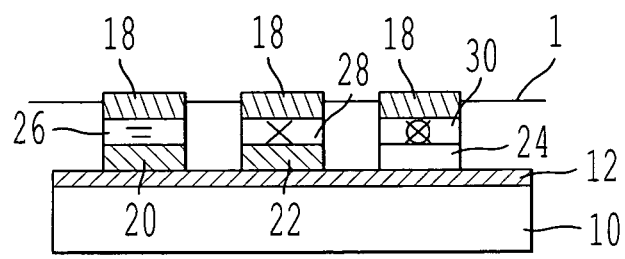

The screen 2 is removed and another screen 1 is positioned and aligned above the n-type organic blocks 26, 28, and 20. The metallic blocks 18 are then formed, as shown in FIG. 7H. The metallic layer 12 serves as a positive electrode and the metallic blocks 18 serve as negative electrodes. The size and spacing of the metallic blocks 18 are the same as that of the p-type and n-type organic blocks 20, 22, 24, 26, 28, and 30.

Figure 7I:
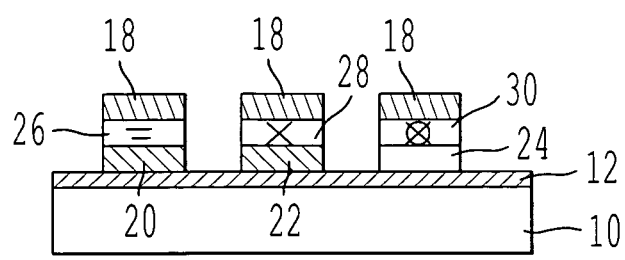

In FIG. 7I, the screen 1 is removed after the metallic blocks 18 form, resulting in the red, green, and blue OLEDs on the same substrate 10 fabricated by the screen-printing method. The structures of the OLEDs of FIGS. 3A–3F may be formed similarly for the red, green, and blue OLEDs.

It is to be understood that the sizes of the p-type, n-type, and metallic blocks 20, 22, 24, 26, 28, 30, and 18 may be different in this embodiment. In this case, different screens may be used to fabricate each set of the blocks, where the openings in the screens are different sizes. The alignment of the different screens may be as previously described.

Figure 8A:
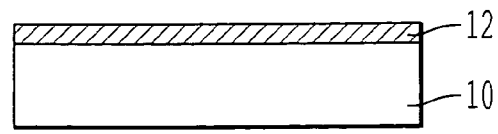
FIGS. 8A–8E show a sixth embodiment of the screen-printing method of the present invention using a single layer of organic material.

FIGS. 8A–8E show a sixth embodiment of the fabrication of OLEDs using screen-printing in which one layer of organic material is used. FIG. 8A shows the deposition of a metallic layer 12 onto a substrate 10. Exemplary metallic layers include indium tin oxide (ITO). The metallic layer 12 forms a continuous layer on the substrate 10. The metallic layer 12 is then cleaned with an ultrasonic bath of acetone, followed by isopropyl alcohol, followed by methanol, for example.

Figure 8B:
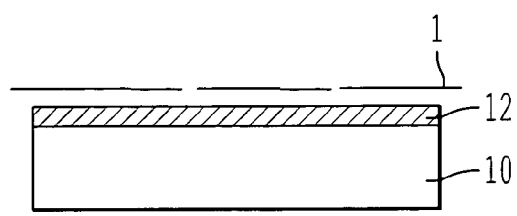

Next, as shown in FIG. 8B, the screen 1 is placed above the metallic layer 12. The openings through which organic material will be deposited onto the metallic layer 12 are shown.

Figure 8C:
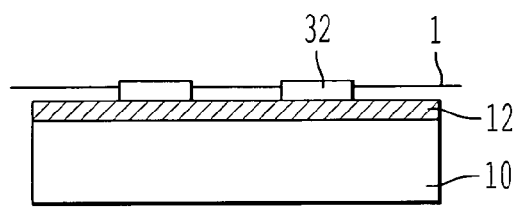
Figure 8D:
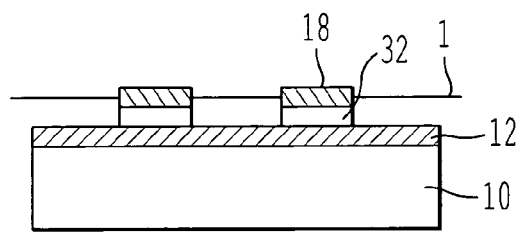

An organic material which is capable of transporting holes and electrons is deposited onto the metallic layer 12 through the screen 1. Prior to deposition, the organic material is doped with a p-type dopant and an n-type dopant. Exemplary organic material includes polymers and/or small organic molecules capable of transporting charge and emitting light, such as polyphenylene vinylene (PPV). The organic material forms organic blocks 32 on the metallic layer 12, as shown in FIG. 8C. The size and spacing of the organic blocks 32 correspond to the size of the openings and the width of the wires, respectively, in the screen After the organic blocks 32 form, the screen 1 is repositioned and aligned above the organic blocks 32 and metallic blocks 18 are formed, as shown in FIG. 8D. The metallic layer 12 serves as a positive electrode and the metallic blocks 18 serve as negative electrodes. The size and spacing of the metallic blocks 18 are the same as that of the organic blocks 32.

Figure 8E:
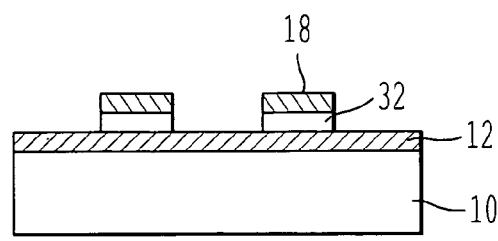

In FIG. 8E, the screen 1 is removed after the metallic blocks 18 form, resulting in the OLEDs fabricated by the screen-printing method.

It is to be understood that the sizes of the blocks 32 and 18 may be different in this embodiment. In this case, different screens may be used to fabricate each set of the blocks 32 and 18, where the openings in the screens are different sizes. The alignment of the different screens may be as previously described.

Figure 9A:
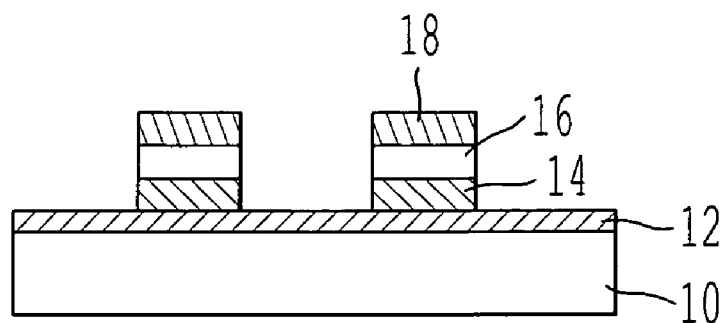
FIGS. 9A and 9B show an embodiment of an OLED display of the present invention.
Figure 9B:
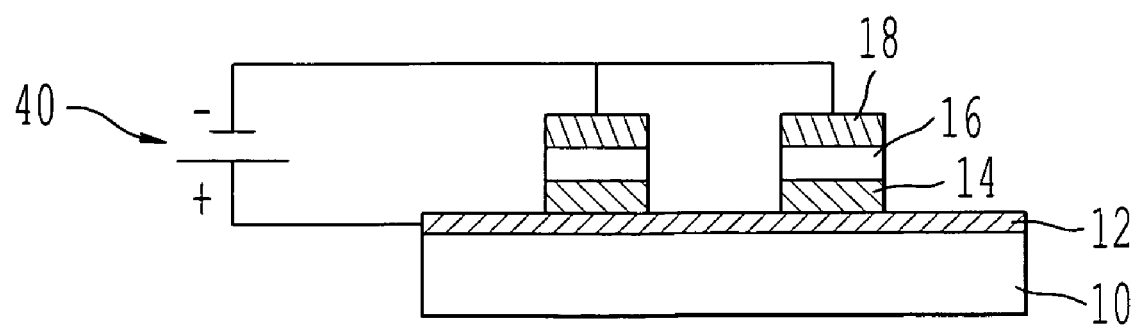

The OLEDs fabricated by the screen-printing methods of the present invention may be used in HD devices. FIGS. 9A and 9B show an embodiment of the fabrication of an OLED display using screen-printing. FIG. 9A shows the OLEDs of FIG. 2F. After the OLEDs are formed, a battery 40 is connected to the metallic layer 12, which is the positive electrode, and in parallel to the metallic blocks 18, which are the negative electrodes. Light is emitted from the OLEDs upon the annihilation of some of the electron-hole pairs in the p- and n-type organic materials that result from recombination of some of the charge carriers in the blocks 14 and 16 when a forward-bias voltage is applied to the OLEDs. The electron-hole pairs are recombined when some negative charge carriers diffuse from the n-type organic material into the p-type organic material and combine with some of the positive charge carriers, mutually annihilating both carriers, and when some positive charge carriers from the p-type organic material diffuse into the n-type organic material and combine with some of the negative charge carriers, also mutually annihilating both carriers.

It is to be understood that the OLED display of the present invention may be made using any of the previously described fabricated OLEDs.

Numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of United States is:

1. In a method for fabricating an organic light-emitting diode in which a first electrode, a first organic material including at least one positive charge carrier, a second organic material including at least one negative charge carrier, and a second electrode are formed as successive layers on a substrate, the improvement comprising:
   screen-printing at least one of the first and second electrodes; and
   screen-printing at least one of the first and second organic materials.

2. The method of claim 1, further comprising:
   depositing the first electrode as a continuous layer on a substrate; and the screen-printing step including,
   positioning a screen above the first electrode,
   depositing the first organic material through openings in the screen onto the first electrode, the first organic material forming uniform, discrete blocks,
   repositioning the screen above the first organic material,
   depositing the second organic material through the openings in the screen onto the first organic material, the second organic material forming uniform, discrete blocks,
   repositioning the screen above the second organic material, and
   depositing the second electrode through the openings in the screen onto the second organic material, the second electrode forming uniform, discrete blocks.

3. The method of claim 2, wherein at least one of the screen-printing steps comprises using a screen made of at least one of metal, plastic, and cloth.

4. The method of claim 1, wherein the screen-printing steps comprise:
   positioning a screen above a substrate;
   depositing the first electrode through openings in the screen onto the substrate, the first electrode forming uniform, discrete blocks;
   repositioning the screen above the first electrode;
   depositing the first organic material through the openings in the screen onto the first electrode, the first organic material forming uniform, discrete blocks;
   repositioning the screen above the first organic material;
   depositing the second organic material through the openings in the screen onto the first organic material, the second organic material forming uniform, discrete blocks;
   repositioning the screen above the second organic material; and
   depositing the second electrode through the openings in the screen onto the second organic material, the second electrode forming uniform, discrete blocks.

5. The method of claim 4, wherein at least one of the screen-printing steps comprises using a screen made of at least one of metal, plastic, and cloth.

6. The method of claim 1, further comprising:
   depositing the first organic material as a continuous layer on the first electrode; and
   the screen-printing steps including,
   positioning a screen above a substrate,
   depositing the first electrode through openings in the screen onto the substrate, the first electrode forming uniform, discrete blocks,
   repositioning the screen above the first organic material,
   depositing the second organic material through the openings in the screen onto the first organic material, the second organic material forming uniform, discrete blocks,
   repositioning the screen above the second organic material, and
   depositing the second electrode through the openings in the screen onto the second organic material, the second electrode forming uniform, discrete blocks.

7. The method of claim 6, wherein at least one of the screen-printing steps comprises using a screen made of at least one of metal, plastic, and cloth.

8. The method of claim 1, further comprising:
   depositing the first electrode as a continuous layer on a substrate; and
   the screen-printing steps including,
   positioning a screen above the first electrode,
   depositing the first organic material through openings in the screen onto the first electrode, the first organic material forming first uniform, discrete blocks,
   repositioning the screen above the first electrode such that the openings in the screen are adjacent to the first uniform, discrete blocks, and
   depositing the first organic material through the openings in the screen onto the first electrode, the first organic material forming second uniform, discrete blocks.

9. The method of claim 8, at least one of the screen-printing steps further comprising:
   repositioning the openings of the screen above the first uniform, discrete blocks;
   depositing the second organic material through the openings in the screen onto the first uniform, discrete blocks, the second organic material forming third uniform, discrete blocks;
   repositioning the openings of the screen above the second uniform, discrete blocks; and
   depositing the second organic material through the openings in the screen onto the second uniform, discrete blocks, the second organic material forming fourth uniform, discrete blocks.

10. The method of claim 9, the screen-printing at least one of the first and second organic materials step further comprising:
    positioning another screen above the second organic material; and
    depositing the second electrode through openings in the another screen onto the third and fourth uniform, discrete blocks, the second electrode forming fifth uniform, discrete blocks.

11. The method of claim 8, wherein at least one of the screen-printing steps comprises using a screen made of at least one of metal, plastic, and cloth.

12. The method of claim 8, wherein the screen-printing at least one of the first and second organic materials step comprises using a first color of the first organic material to form the first uniform, discrete blocks and a second color of the first organic material to form the second uniform, discrete blocks.

13. The method of claim 9, wherein the screen-printing at least one of the first and second organic materials step comprises using a first color of the second organic material to form the third uniform, discrete blocks and a second color of the second organic material to form the fourth uniform, discrete blocks.

14. The method of claim 9, wherein at least one of the screen-printing steps comprises using a screen made of at least one of metal, plastic, and cloth.

15. A The method of claim 1, wherein the second electrode includes indium tin oxide.

16. A method for forming a pattern of organic material on a substrate, comprising:
   positioning above the substrate a screen including openings that form the pattern;
   depositing the organic material on the substrate through the openings in the screen; and
   screen-printing an electrode above the substrate.

17. In a method for fabricating an organic light-emitting diode in which a first electrode, an organic material including at least one positive charge carrier and at least one negative carrier, and a second electrode are formed as successive layers on a substrate, the improvement comprising:
   screen-printing at least one of the first and second electrodes; and
   screen-printing the organic material.

18. The method of claim 17, further comprising:
   depositing the first electrode as a continuous layer on a substrate; and
   the screen-printing steps including,
   positioning a screen above the first electrode,
   depositing the organic material through openings in the screen onto the first electrode, the organic material forming uniform, discrete blocks,
   repositioning the screen above the organic material, and
   depositing the second electrode through the openings in the screen onto the organic material, the second electrode forming uniform, discrete blocks.

19. The method of claim 18, wherein at least one of the screen-printing steps comprises using a screen made of at least one of metal, plastic, and cloth.

20. In a method for fabricating an organic light-emitting diode display in which a first electrode, a first organic material including at least one positive charge carrier, a second organic material including at least one negative charge carrier, and a second electrode are formed as successive layers on a substrate and a voltage source connects the first and second electrodes, the improvement comprising:
   screen-printing at least one of the first and second electrodes; and
   screen-printing at least one of the first and second organic materials.

21. The method of claim 20, further comprising:
   depositing the first electrode as a continuous layer on a substrate; and
   the screen-printing steps including,
   positioning a screen above the first electrode,
   depositing the first organic material through openings in the screen onto the first electrode, the first organic material forming uniform, discrete blocks,
   repositioning the screen above the first organic material,
   depositing the second organic material through the openings in the screen onto the first organic material, the second organic material forming uniform, discrete blocks, repositioning the screen above the second organic material, and
   depositing the second electrode through the openings in the screen onto the second organic material, the second electrode forming uniform, discrete blocks.

* * * * *